(12) United States Patent  
Frisina

(10) Patent No.: US 6,300,171 B1  
(45) Date of Patent: Oct. 9, 2001

(54) METHOD OF MANUFACTURING AN INTEGRATED EDGE STRUCTURE FOR HIGH VOLTAGE SEMICONDUCTOR DEVICES, AND RELATED INTEGRATED EDGE STRUCTURE

(75) Inventor: Ferruccio Frisina, S. Agata li Battiati (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/457,069

(22) Filed: Dec. 7, 1999

(30) Foreign Application Priority Data

Dec. 9, 1998 (EP) .................................. 98830739

(51) Int. Cl.[7] .................................................. H01L 21/332
(52) U.S. Cl. ........................ 438/140; 438/185; 438/222; 438/542
(58) Field of Search .................................... 257/168, 409; 438/140, 174, 181, 185, 222, 224, 232, 372, 373, 542, 545

(56) References Cited

U.S. PATENT DOCUMENTS

| 5,633,180 | * | 5/1997 | Bajor | 438/358 |
| 5,798,187 | * | 8/1998 | Ronsisvalle | 438/133 |
| 5,900,662 | * | 5/1999 | Frisina et al. | 257/341 |
| 5,963,798 | * | 10/1999 | Kim et al. | 438/199 |
| 6,010,926 | * | 1/2000 | Rho et al. | 438/199 |

FOREIGN PATENT DOCUMENTS

| A-0 413 256 | 2/1991 | (EP) | H01L/27/08 |
| A-0 757 382 | 2/1997 | (EP) | H01L/23/00 |
| A-2 163 597 | 2/1986 | (GB) | H01L/29/06 |
| 401223765-A | * | 9/1989 | (JP) . | |

OTHER PUBLICATIONS

Patent Abstracts of Japan, vol. 006, No. 264 (E–150), Dec. 23, 1982 & JP–A–57 159060 (Nippon Denki KK).
Patent Abstracts of Japan, vol. 008, No. 081 (E–238), Apr. 13, 1984 & JP–A–59 002344 (Nippon Denki KK).
Patent Abstracts of Japan, vol. 014, No. 036 (E–877), Jan. 23, 1990 & JP–A–01 270346 (Fuji Electric Co. Ltd.).
Patent Abstracts of Japan, vol. 096, No. 010, Oct. 31, 1996 & JP–A–08 167714 (Sanyo Electric Co. Ltd.).

* cited by examiner

Primary Examiner—Olik Chaudhuri
Assistant Examiner—Hoai Pham
(74) Attorney, Agent, or Firm—Wolf, Greenfield & Sacks, P.C.; James H. Morris; Theodore E. Galanthay

(57) ABSTRACT

Method of manufacturing an edge structure for a high voltage semiconductor device, including a first step of forming a first semiconductor layer of a first conductivity type, a second step of forming a first mask over the top surface of the first semiconductor layer, a third step of removing portions of the first mask in order to form at least one opening in it, a fourth step of introducing dopant of a second conductivity type in the first semiconductor layer through the at least one opening, a fifth step of completely removing the first mask and of forming a second semiconductor layer of the first conductivity type over the first semiconductor layer, a sixth step of diffusing the dopant implanted in the first semiconductor layer in order to form a doped region of the second conductivity type in the first and second semiconductor layers. The second step up to the sixth step are repeated at least one time in order to form a final edge structure including a number of superimposed semiconductor layers of the first conductivity type and at least two columns of doped regions of the second conductivity type, the columns being inserted in the number of superimposed semiconductor layers and formed by superimposition of the doped regions subsequently implanted through the mask openings, the column near the high voltage semiconductor device being deeper than the column farther from the high voltage semiconductor device.

11 Claims, 5 Drawing Sheets

METHOD OF MANUFACTURING AN INTEGRATED EDGE STRUCTURE FOR HIGH VOLTAGE SEMICONDUCTOR DEVICES, AND RELATED INTEGRATED EDGE STRUCTURE

BACKGROUND OF THE INVENTION

1. Field of the Invention

The present invention relates to a method of manufacturing an integrated edge structure for high voltage semiconductor devices, and to the related integrated edge structure.

2. Discussion of the Related Art

High voltage semiconductor devices, for example MOS-gated power devices, include PN junctions which must withstand high reverse voltage. Most of PN junctions fabricated by planar technology essentially consist of a first semiconductor region of a given conductivity type diffused into a second semiconductor region of opposite conductivity type.

A depletion region is associated with the PN junction, which can be considered as made up of two regions, a first one along the plane portion of the junction, a second one at the edges of said plane portion. The electric field has a different behavior in the two regions. In the plane portion the equipotential lines are parallel to the junction, the maximum electric field is located at the junction and the breakdown occurs when it reaches the critical value $E_{CR}$. At the junction edges, because of the finite junction depth, the equipotential lines are curved, and spaced closer together than in the plane portion. As a consequence, the electric field increases, higher electric fields are associated with smaller curvature radii, i.e. a shallower junction. The breakdown voltage of a PN diffused junction is usually lower than that of the corresponding plane junction, since the electric field in the edge region is much higher. The ratio between the breakdown voltage of the edge and the plane portion is thus below unity.

Several techniques have been developed to increase the ratio, essentially by changing the size of the depletion layer to avoid local increases in the electric field which can lead to early breakdown.

For example GB-A-2163597 describes a technique wherein one or more high resistivity rings are provided around the lateral edges of the junction; in this way the depletion layer spreads over wider regions, so that the spatial charge distribution is widened and the electric field is consequently reduced. The rings are formed by implantation and diffusion of dopants; by controlling the implanted dose and the diffusion process, it is possible to achieve the desired resistivity. Two or more concentric rings, with increasing resistivity from the inner to the outer one, are necessary when the device must withstand high reverse voltages. However, peaks in the electric field value are observed at the interface between two rings, and at the edge of the outer ring. An increase in the number of rings leads to larger spreading of the depletion layer, and the peaks in the electric field are lowered.

Other techniques used for reducing the electric field include rings with high junction depth, floating rings and so on.

In view of the state of the art described, it is an object of the present invention to provide a method of manufacturing an integrated edge structure for high voltage semiconductor devices.

SUMMARY OF THE INVENTION

According to the present invention, this and other objects are achieved by a method of manufacturing an edge structure for a high voltage semiconductor device, comprising a first step of forming a first semiconductor layer of a first conductivity type, a second step of forming a first mask over the top surface of said first semiconductor layer, a third step of removing portions of said first mask in order to form at least one opening in it, a fourth step of introducing dopant of a second conductivity type in said first semiconductor layer through said at least one opening, a fifth step of completely removing said first mask and of forming a second semiconductor layer of the first conductivity type over said first semiconductor layer, a sixth step of diffusing the dopant implanted in said first semiconductor layer in order to form a doped region of the second conductivity type in said first and second semiconductor layers, repeating at least one time the second step up to the sixth step in order to form a final edge structure comprising a number of superimposed semiconductor layers of the first conductivity type and at least two columns of doped regions of the second conductivity type, said columns being inserted in said number of superimposed semiconductor layers and formed by superimposition of said doped regions subsequently implanted through the mask openings, the column near said high voltage semiconductor device being deeper than the column farther from said high voltage semiconductor device.

BRIEF DESCRIPTION OF THE DRAWINGS

The features and advantages of the present invention will be made more evident by the following detailed description of a particular embodiment thereof, illustrated as a non limiting example in the annexed drawings, wherein.

DETAILED DESCRIPTION

Figure 1:
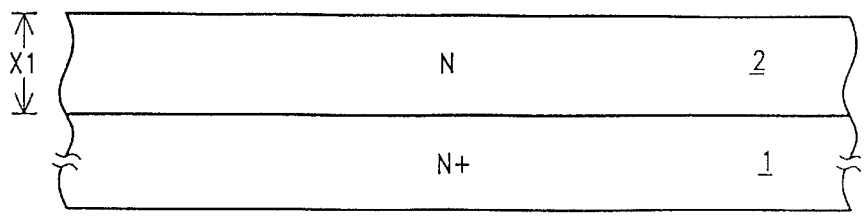
FIGS. 1 to 6 are cross-sectional views of a high voltage MOS-gated power device showing intermediate steps of a related manufacturing process.

Referring to FIG. 1, a lower semiconductor layer 2 of the N conductivity type is formed by means of an epitaxial growth over an N+ semiconductor substrate 1. Epitaxial layer 2 has a thickness X1 approximately equal to the size of the elementary functional units, be they cells or stripes, i.e., for example, 5 to 15 μm. The thickness X1 of epitaxial layer 2 is much lower, e.g. one third or less, than the overall thickness of the drain layer of the final device. The doping level of epitaxial layer 2 is higher than that required for assuring that the device keeps the desired high voltage. A doping level of $5 \times 10^{14} - 3 \times 10^{15}$ atoms/cm$^3$ (5–10 ohm/cm) is suitable.

Figure 2:
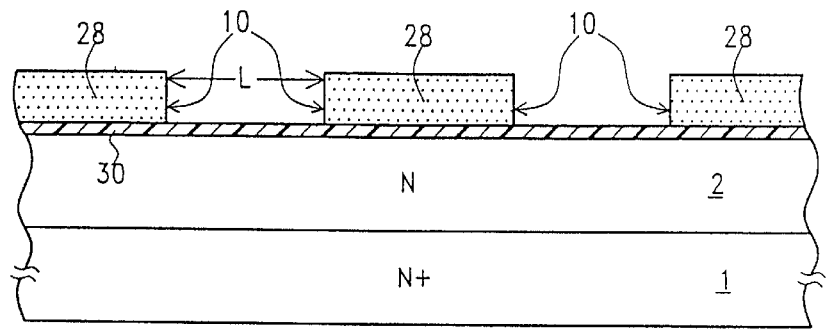

With reference to FIG. 2, an oxide layer 30 and a photoresist layer 28 are then formed over the top surface of epitaxial layer 2. The photoresist layer 28 is then selectively removed from the areas wherein the elementary cells or stripes will be formed, i.e. in openings 10. The size L of the openings 10 in the photoresist layer 28 is slightly lower than the size of the memory cells or stripes.

Figure 3:
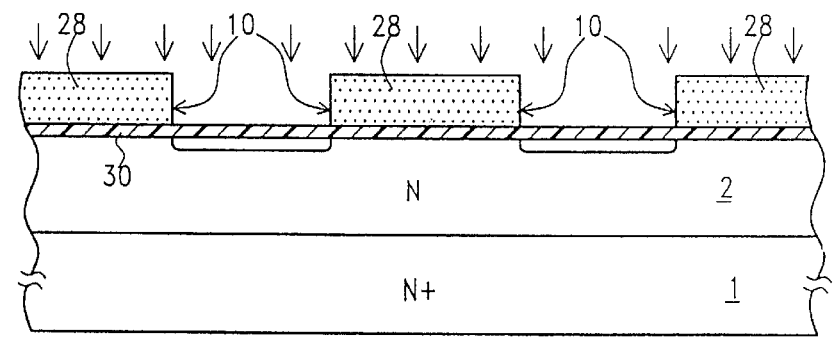

Referring to FIG. 3, a P type dopant such as boron or aluminum is then selectively implanted into the epitaxial layer 2, using the photoresist layer 28 as a mask. The oxide layer 30 has a thin thickness so that it does not prevent the ion implantation and protects the top surface of epitaxial layer 2 during the removal of the photoresist layer 28. A suitable implantation energy is in the range 100 to 900 keV. The implant dose is chosen in such a way that, after the thermal diffusion processes that will follow, the implanted P type dopant inverts the N type doping of the epitaxial layer 2. A suitable dose ranges from $5 \times 10^{11}$ to $1 \times 10^{13}$ atoms/cm$^2$.

Figure 4:
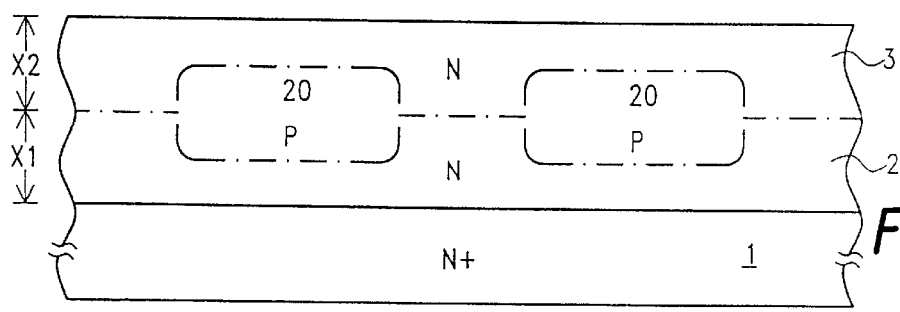

With reference to FIG. 4, the photoresist layer 28 and the oxide layer 30 are then completely removed, and an intermediate epitaxial layer 3 of the N conductivity type is formed over the lower epitaxial layer 2. Preferably, the thickness X2 of the intermediate epitaxial layer 3 and its dopant concentration are respectively similar to the thickness X1 and dopant concentration of the lower epitaxial layer 2. During the growth of the intermediate epitaxial layer 3, that as known involves a thermal process, the P type dopant previously implanted diffuses into the lower and intermediate epitaxial layers 2, 3, thus forming P regions 20 having dopant concentration approximately lower than or equal to $10^{15}$ atoms/cm$^3$.

Figure 5:
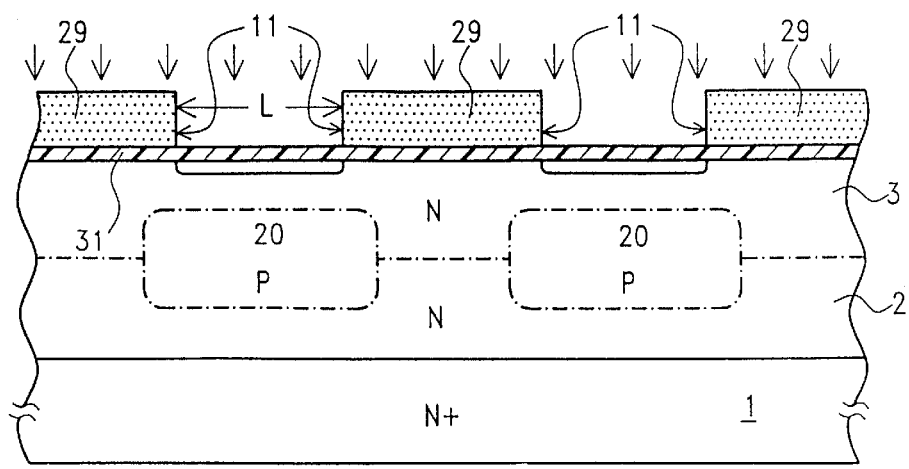

Referring to FIG. 5, another oxide layer 31 and photoresist layer 29 are then formed over the intermediate epitaxial layer 3. The photoresist layer 29 is then selectively removed using the same photolithographic mask previously used to remove the photoresist layer 28, and openings 11 are formed. A P type dopant such as boron or aluminum is then selectively implanted through the openings 11 using the photoresist layer 29 as a mask, as in the step depicted in FIG. 3. The implantation dose and energy are chosen in the same way as before.

Figure 6:
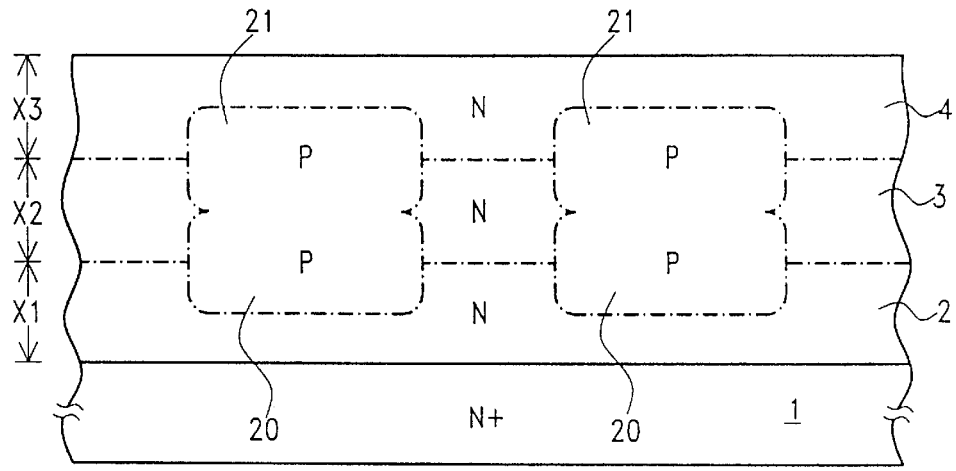

With reference to FIG. 6, the photoresist layer 29 and the oxide layer 31 are then completely removed, and an upper epitaxial layer 4 of the N conductivity type is formed over the intermediate epitaxial layer 3. Preferably, the thickness X3 and the dopant concentration of the upper epitaxial layer 4 are respectively similar to the thickness X2 and the dopant concentration of the intermediate epitaxial layer 3. During the growth of the upper epitaxial layer 4, that involves a thermal process, the P type dopant previously implanted diffuses into the intermediate and upper epitaxial layers 3, 4, to form P regions 20, and also regions 21 further diffuse vertically. In this way, P regions 20 and P regions 21 merge, forming columns of stacked P regions 20, 21. The dopant concentration of P regions 20 and 21, together with their geometrical disposition and size, is suitable to sustain the desired high voltage. In fact, the total charge amount in the P regions 20, 21 and in the N drain regions therebetween must be the same, and so there is a correlation between the geometrical size of the above-mentioned regions and their concentration.

Figure 7:
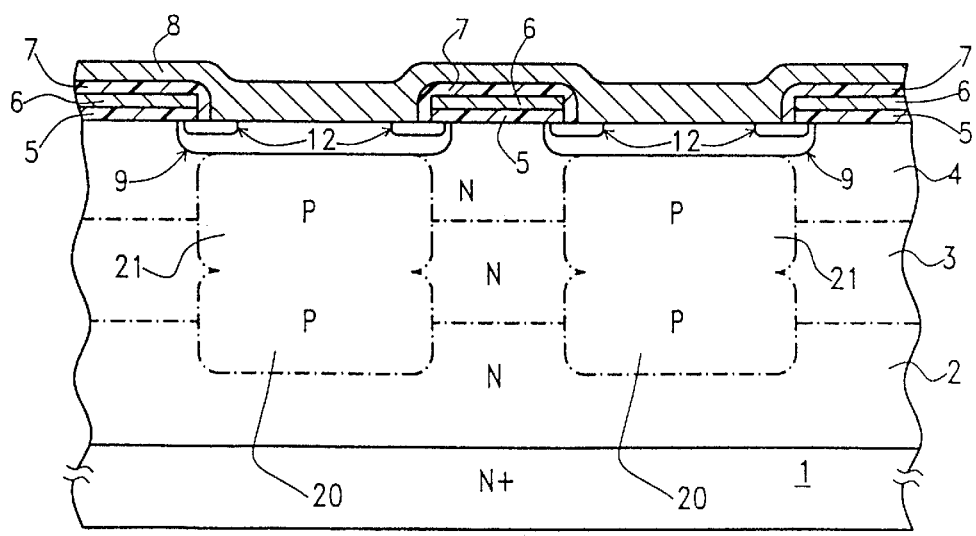
FIG. 7 shows in cross-section the high voltage MOS-gated power device obtained according to the manufacturing process steps of FIGS. 1 to 6.

The following process steps involve forming body regions 9 in the upper epitaxial layer 4, and source regions 12 inside the body regions 9. The top surface of the upper epitaxial layer 4 is covered by an insulated gate layer comprising a thin gate oxide layer 5 and a polysilicon layer 6. Openings are provided in the insulated gate layer over each body region 9. The insulated gate layer is covered by an insulating material layer 7 in which contact windows are provided over each body region 9 to allow a source metal layer 8 to contact the source regions 12 and the body regions 9, as shown in FIG. 7.

As an alternative, instead of performing, into each of the epitaxial layers 2 and 3 a single implant, several implants can be performed in succession into each of the epitaxial layers 2 and 3. Each implant of the succession is performed with a respective energy, so as to locate the peak dopant concentration at a respective depth. The dose of these implants ranges form $5 \times 10^{12}$ to $5 \times 10^{13}$ atoms/cm$^2$, and the energies range from 100 keV to 900 keV or more. For example, where the implanted dopant is boron, three implants at 300 keV, 600 keV and 900 keV can be performed, so as to have peak dopant concentrations located at a depth of 0.7 $\mu$m, 1.2 $\mu$m and 1.7 $\mu$m, respectively.

In this way, "box" shaped concentration profiles are obtained.

Clearly, the number of stacked epitaxial layers can be different from three. The number of epitaxial layers to be formed depends on the overall thickness of the drain layer of the final device, i.e., on the voltage to be sustained by the power device.

FIGS. 8 to 12 are cross-sectional views of a high voltage MOS-gated power device 100 and related edge structure 101, showing intermediate steps of a related manufacturing process, according to the present invention. All the process considerations described above, for example about the thickness and resistivity of the epitaxial layers or the dose and energy of the implantations, are valid even in this case.

The process steps are the same process steps described above, comprising a first, a second and a third oxide layer 32, 33, 34 and a first, a second and a third photoresist layer 37, 38, 39 used as manufacturing masks, the formations of superimposed N type semiconductor layers 41, 42, 43 over a N+ type semiconductor substrate 40, the related ion implantations of the P conductivity type for forming superimposed P doped regions 22, 23 in the semiconductor N layers.

Figure 8:
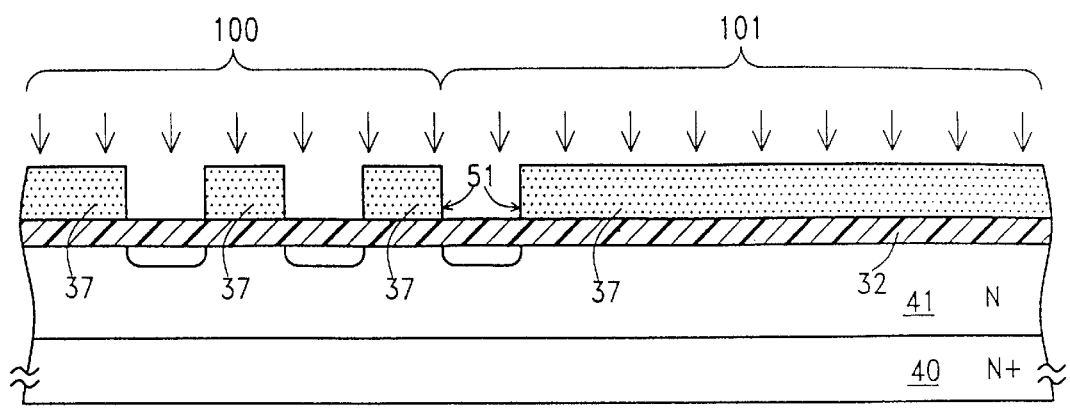
FIGS. 8 to 12 are cross-sectional views of a high voltage MOS-gated power device and related edge structure, showing intermediate steps of a related manufacturing process, according to the present invention.

The previously described manufacturing process is in this case also used to form an edge structure 101 for the power device 100. The edge structure 101 is obtained by the same manufacturing process, without adding any process step, but using modified masks for the P dopant implantations. Particularly, the mask 37 comprises a first opening 51 in the region wherein the edge structure 101 will be formed, this first opening 51 being located near the active area wherein the power device 100 will be formed (FIG. 8).

Figure 9:
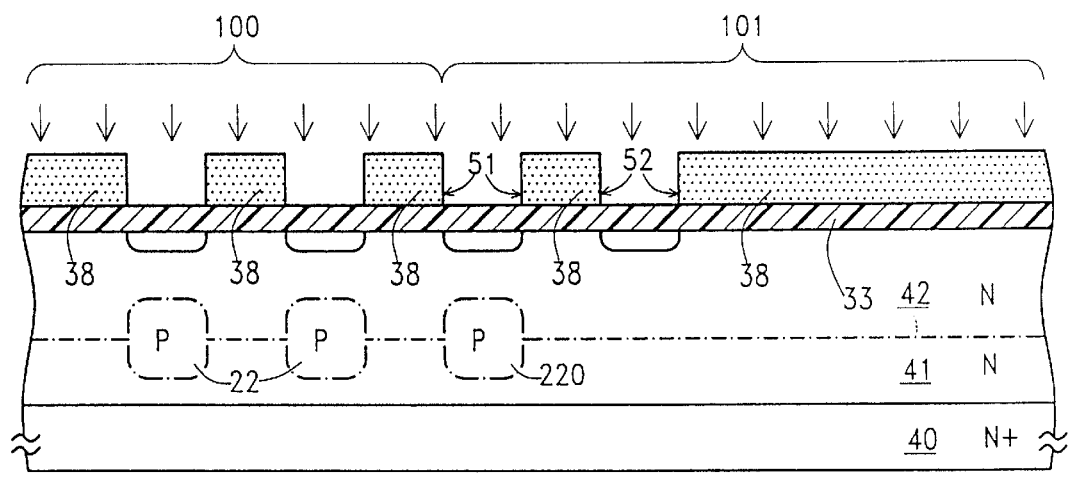

After the subsequent steps of implanting P type dopant, removing the mask 37 and the oxide layer 32, growing the N semiconductor layer 42, including thermal diffusion steps of the implanted dopant, a P doped region 220, similar to the P doped regions 22 in the active area 100, is obtained also in the edge structure area 101 near the active area 100 (FIG. 9).

In the next step, the second mask 38, superimposed to an oxide layer 33, is formed over the entire device and it comprises the same openings of the preceding mask 37 but also a second opening 52 in the edge structure area 101, suitably distanced from the first opening 51 (FIG. 9).

Figure 10:
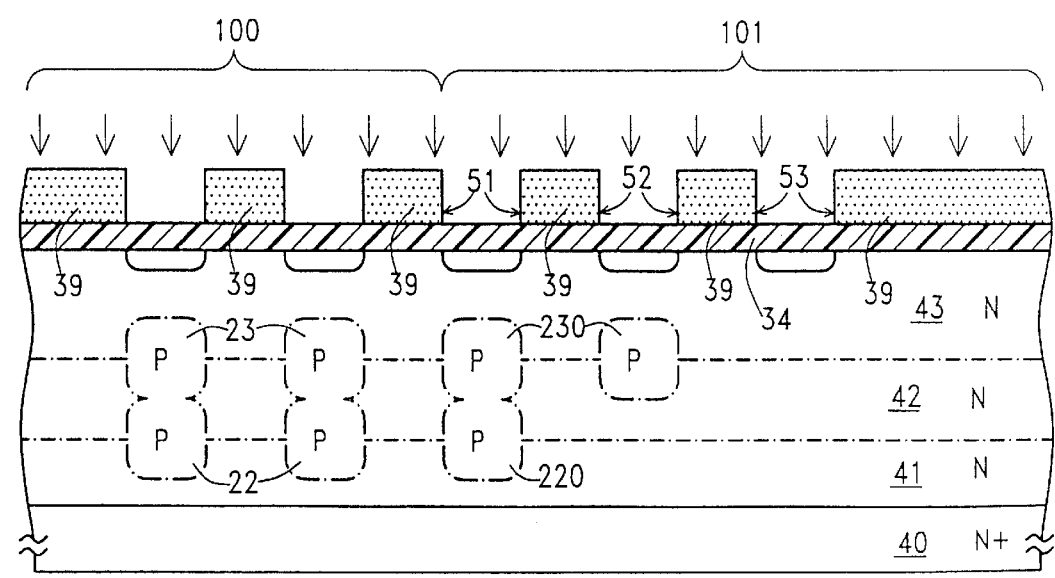

In this way, repeating the same process steps as above, two P doped regions 230 are formed in the edge structure area 101, one of them superimposed and merged to the preceding P doped region 220 in order to form one merged P doped region (FIG. 10).

Figure 11:
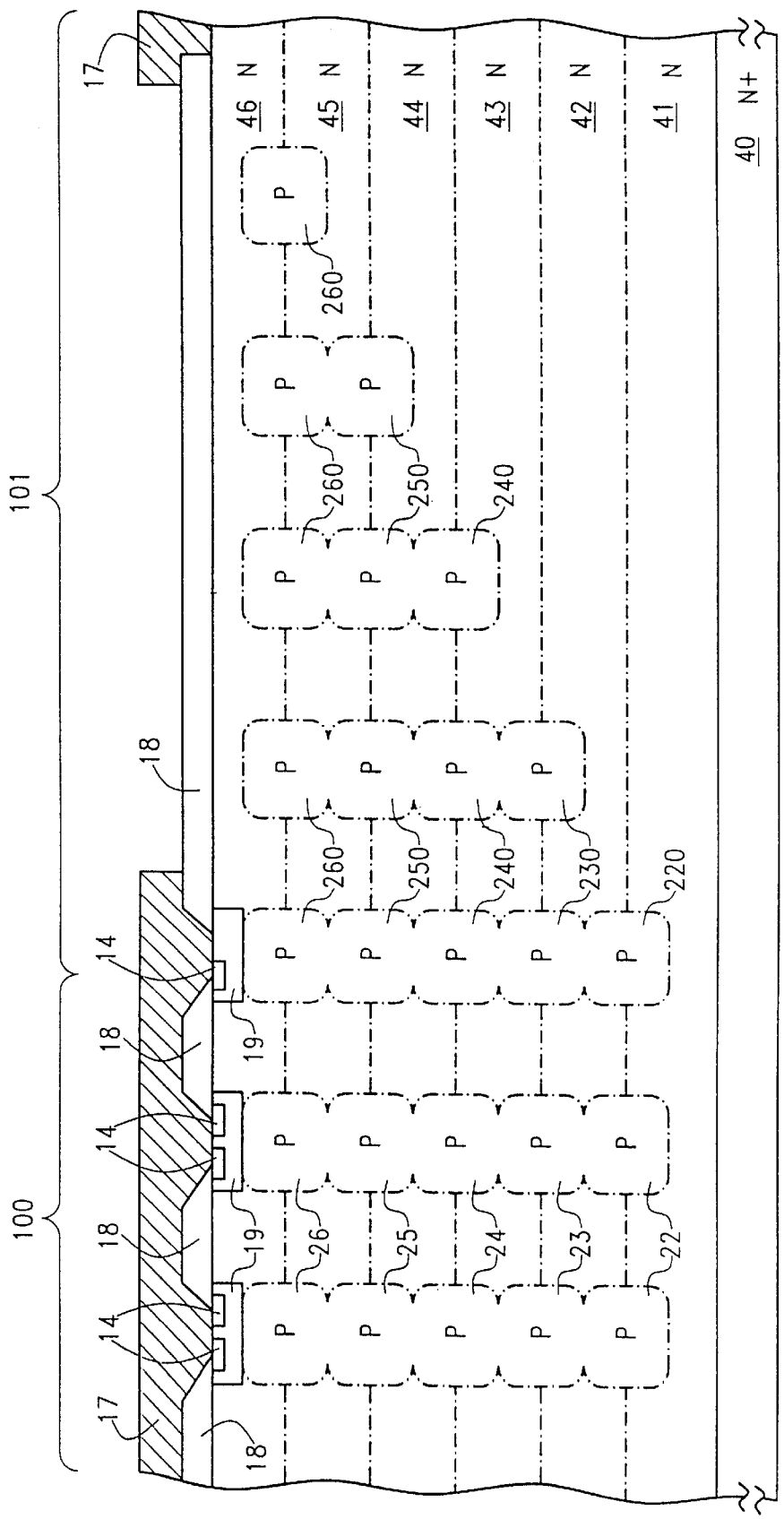

By repeating the same process steps and using every time a different photoresist mask having a new opening in the edge structure area 101 (e.g. the next mask 39 and its opening 53 in FIG. 10), a final device as shown in FIG. 11 is obtained. In this case, it provides six superimposed N semiconductor layers 41 to 46 and so five superimposed P doped regions 22 to 26 (merged in two singles "pockets") in the active area 100.

The final edge structure is constituted by a number (e.g. five) of P doped "columns", each column comprising merged superimposed P doped regions and having a different height, i.e. depth, in the N semiconductor layers (in proportion to the number of merged P doped regions in it). Particularly, the height of the P doped columns in the structure edge area 101 decreases shifting from the zone near the active area 100 to the outside (the outer column comprises only one P doped region 260). Moreover, the final device comprises also body regions 19, source regions 14, insulated gate layers 18, and metal layers 17 for electrical connections.

Figure 12:
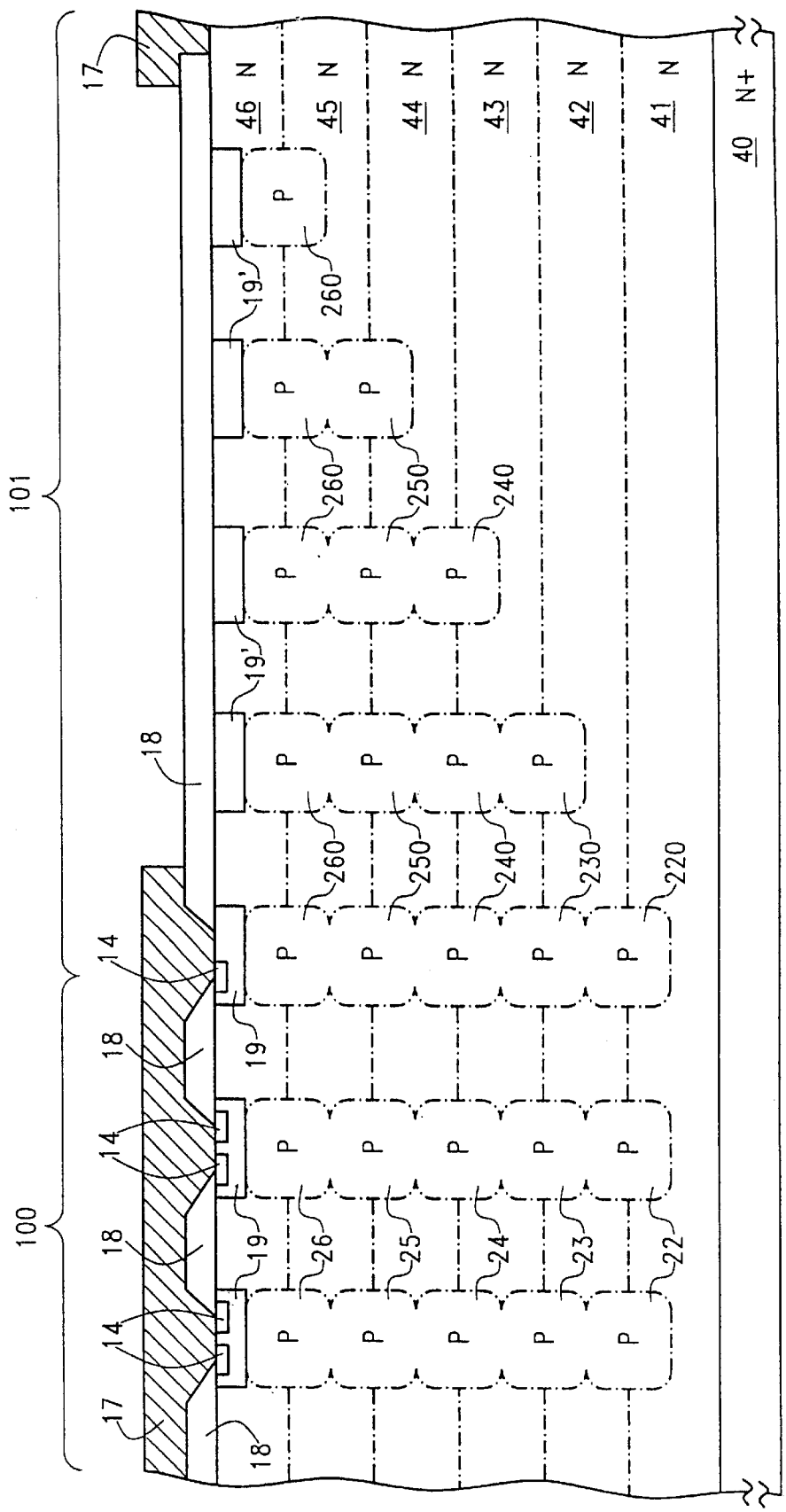

FIG. 12 shows another preferred final edge structure, very similar to that of FIG. 11, wherein the P doped columns in the structure edge area 101 have body regions 19' on their upper surfaces.

As an alternative, it is possible to grow epitaxial layers with higher thickness, possibly reducing the overall number of the same epitaxial layers, in order to obtain, both in the active area and in the edge structure area, stacked P regions not vertically merged to each other to form an unique P column. These not merged stacked P regions are, however, electrically connected due to the electric field applied during the device working.

Such edge structures are suitable to withstand a high voltage due to the very large radius of curvature obtained by means of the different depths of the P doped columns.

It is evident that the number of N type semiconductor layers can be different from six and so that of the P doped regions inside them, depending on the overall thickness of the drain layer of the final device, i.e., on the voltage to be sustained by the power device.

It is moreover evident that such edge structures can be associated even with different power devices which do not provide such a manufacturing method as that shown in FIGS. 1 to 7.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claim is:

1. Method of manufacturing an edge structure for a high voltage semiconductor device, comprising: a first step of forming a first semiconductor layer of a first conductivity type; a second step of forming a first mask over the top surface of said first semiconductor layer; a third step of removing portions of said first mask in order to form at least one opening in it; a fourth step of introducing dopant of a second conductivity type in said first semiconductor layer through said at least one opening; a fifth step of completely removing said first mask and forming a second semiconductor layer of the first conductivity type over said first semiconductor layer; a sixth step of diffusing the dopant implanted in said first semiconductor layer in order to form a doped region of the second conductivity type in said first and second semiconductor layers; and repeating at least one time the second step up to the sixth step in order to form a final edge structure comprising a number of superimposed semiconductor layers of the first conductivity type and at least two columns of doped regions of the second conductivity type, said columns being inserted in said number of superimposed semiconductor layers and formed by superimposition of said doped regions subsequently implanted through the mask openings, wherein each mask for forming said column of doped regions has an additional opening in respect to the preceding mask, said additional opening being properly distanced from the preceding opening in order to form an additional column, the column near said high voltage semiconductor device being deeper than the column farther from said high voltage semiconductor device.

2. Manufacturing method according to claim 1, wherein said superimposed doped regions of each column are vertically merged to each other.

3. Manufacturing method according to claim 1, wherein said superimposed doped regions of each column are not vertically merged to each other.

4. Manufacturing method according to claim 1, wherein said mask is a photoresist layer.

5. Manufacturing method according to claim 1, comprising the step of forming an oxide layer over the top surface of each one of said semiconductor layers before the formation of said mask, and the removal of said oxide layer during the removal of said mask.

6. Manufacturing method according to claim 5, wherein said oxide layer has a thin thickness suitable to not prevent the subsequent steps of introducing dopant.

7. Manufacturing method according to claim 1, wherein said step of introducing dopant is a ion implantation.

8. Manufacturing method according to claim 1, wherein said high voltage semiconductor device is a power MOSFET.

9. Manufacturing method according to claim 1, wherein said first semiconductor layer is epitaxially grown over a semiconductor substrate of the first conductivity type.

10. Manufacturing method according to claim 1, wherein said first type of conductivity is the N type and said second type of conductivity is the P type.

11. Manufacturing method according to claim 1, wherein said first type of conductivity is the P type and said second type of conductivity is the N type.

* * * * *